United States Patent
Nam et al.

(10) Patent No.: US 10,431,547 B2
(45) Date of Patent: Oct. 1, 2019

(54) SEMICONDUCTOR PACKAGE

(71) Applicant: Samsung Electronics Co., Ltd., Suwon-si, Gyeonggi-do (KR)

(72) Inventors: Geol Nam, Suwon-si (KR); Young Lyong Kim, Anyang-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 14 days.

(21) Appl. No.: 15/870,910

(22) Filed: Jan. 13, 2018

(65) Prior Publication Data

US 2019/0013272 A1    Jan. 10, 2019

(30) Foreign Application Priority Data

Jul. 5, 2017    (KR) .................. 10-2017-0085477

(51) Int. Cl.
*H01L 23/48*    (2006.01)
*H01L 23/538*    (2006.01)
*H01L 25/065*    (2006.01)

(52) U.S. Cl.
CPC ...... *H01L 23/5385* (2013.01); *H01L 23/5384* (2013.01); *H01L 23/5386* (2013.01); *H01L 25/0657* (2013.01)

(58) Field of Classification Search
CPC ............. H01L 23/5385; H01L 23/5384; H01L 23/5386; H01L 25/0657
See application file for complete search history.

(56) References Cited

U.S. PATENT DOCUMENTS

| | | | |
|---|---|---|---|
| 8,497,576 B2 | 7/2013 | Fujii | |
| 8,786,102 B2 | 7/2014 | Yoshida et al. | |
| 8,941,246 B2 | 1/2015 | Miura et al. | |
| 9,184,153 B2 | 11/2015 | Lu et al. | |
| 9,343,433 B2 | 5/2016 | Lee et al. | |
| 9,412,675 B2 * | 8/2016 | Gandhi | H01L 23/4012 |
| 9,461,029 B2 | 10/2016 | Jang et al. | |
| 2016/0112083 A1 | 4/2016 | Keller et al. | |
| 2016/0329304 A1 | 11/2016 | Hatakeyama et al. | |
| 2017/0038209 A1 | 2/2017 | Bowles et al. | |
| 2017/0068638 A1 | 3/2017 | Wallichs et al. | |

FOREIGN PATENT DOCUMENTS

| KR | 101013548 B1 | 2/2011 |
|---|---|---|
| KR | 101069517 B1 | 9/2011 |

\* cited by examiner

*Primary Examiner* — Hoa B Trinh
(74) *Attorney, Agent, or Firm* — Renaissance IP Law Group LLP (57) ABSTRACT

A semiconductor package is provided including a package substrate, a first semiconductor chip on the substrate, with a first surface and a second surface opposite to each other; a plurality of first connection terminals disposed on the first surface contacting an upper surface of the substrate; a second semiconductor chip disposed on the second surface, with a third surface and a fourth surface opposite to each other; a plurality of second connection terminals disposed on the third surface contacting the second surface, wherein an absolute value between a first area, the sum of areas in which the plurality of first connection terminals contact the upper surface of the package substrate, and a second area, the sum of areas in which the plurality of second connection terminals contact the second surface of the first semiconductor chip, is equal to or less than about 0.3 of the first area.

19 Claims, 9 Drawing Sheets

SEMICONDUCTOR PACKAGE

This application claims priority from Korean Patent Application No. 10-2017-0085477 filed on Jul. 5, 2017 in the Korean Intellectual Property Office, the disclosure of which is incorporated herein by reference in its entirety.

BACKGROUND

1. Technical Field

The present inventive concept relates to a semiconductor package.

2. Description of the Related Art

The thickness of the semiconductor package is decreasing due to a sliming tendency of electronic devices. Meanwhile, as the thickness of the semiconductor package decreases, more semiconductor chips may be stacked on a package substrate. Thus a method for preventing the inclination of stacked semiconductor chips is needed. In addition, a method for effectively dissipating the heat generated from the semiconductor chip is also needed.

SUMMARY

An aspect of the present inventive concept provides a semiconductor package capable of securing uniform bonding to prevent inclination of a semiconductor chip.

According to an exemplary embodiment of the present inventive concept, there is provided a semiconductor package comprising a package substrate, a first semiconductor chip disposed on the package substrate, and includes a first surface and a second surface opposite to each other, a plurality of first connection terminals disposed on the first surface of the first semiconductor chip and in contact with an upper surface of the package substrate, a second semiconductor chip overlying the second surface of the first semiconductor chip, and includes a third surface and a fourth surface opposite to each other, and a plurality of second connection terminals disposed on the third surface of the second semiconductor chip and in contact with the second surface of the first semiconductor chip, wherein an absolute value between a first area, which is a sum of areas in which the plurality of first connection terminals contacts the upper surface of the package substrate, and a second area which is a sum of areas in which the plurality of second connection terminals contacts the second surface of the first semiconductor chip, is equal to or less than about 0.3 of the first area.

According to an exemplary embodiment of the present inventive concept, there is provided a semiconductor package comprising a package substrate, a first semiconductor chip disposed on a package substrate, and includes a first surface and a second surface opposite to each other, a first signal connection terminal disposed between the first surface of the first semiconductor chip and an upper surface of the package substrate, and electrically connects the first semiconductor chip and the package substrate, a first dummy connection terminal interposed between the first surface of the first semiconductor chip and the upper surface of the package substrate and spaced apart from the first signal connection terminal, a second semiconductor chip disposed on the second surface of the first semiconductor chip, and includes a third surface and a fourth surface opposite to each other, a second signal connection terminal disposed between the third surface of the second semiconductor chip and the second surface of the first semiconductor chip, and electrically connects the first semiconductor chip and the second semiconductor chip and second and third semiconductor chips which are between the third surface of the second semiconductor chip and the second surface of the first semiconductor chip, and are spaced apart from the second signal connection terminal, wherein at least a part of the first dummy connection terminal and at least a part of the second dummy connection terminal vertically overlap each other, and the first dummy connection terminal and the third dummy connection terminals vertically overlap each other.

According to an exemplary embodiment of the present inventive concept, there is provided a semiconductor package comprising a package substrate including a substrate pad on an upper surface thereof, a first signal connection terminal electrically connected to the substrate pad, a first dummy connection terminal spaced apart from the substrate pad and the first signal connection terminal and disposed on the package substrate, a first semiconductor chip disposed on the first dummy connection terminal and the first signal connection terminal, and includes a first via electrically connected to the first signal connection terminal, a second signal connection terminal connected to the first via and disposed on the first semiconductor chip, a second dummy connection terminal spaced apart from the first via and the second signal connection terminal and disposed on the first semiconductor chip and a plurality of second semiconductor chips sequentially stacked on the second dummy connection terminal and the second signal connection terminal, each of the plurality of second semiconductor chips being electrically connected through a second via penetrating each of the plurality of second semiconductor chips, wherein a first area is a sum of an area in which the first signal connection terminal contacts the upper surface of the package substrate, and an area in which the first dummy connection terminal contacts the upper surface of the package substrate, a second area is a sum of an area in which the second signal connection terminal contacts the first semiconductor chip, and an area in which the second dummy connection terminal contacts the first semiconductor chip, and an absolute value of a difference between the first area and the second area is about 0.3 or less of the first area.

In some embodiments, the first semiconductor chip comprises a first pad disposed on an upper surface thereof and in contact with the second signal connection terminal, and a second pad disposed on the upper surface of the first semiconductor chip and in contact with the second dummy connection terminal, and wherein the second area is a value measured at a boundary in which the first pad and the second signal connection terminal are in contact with each other and a boundary in which the second pad and the second dummy connection terminal are in contact with each other.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION

Hereinafter, semiconductor packages according to exemplary embodiments of the present inventive concept will be described with reference to FIGS. 1 to 5.

Figure 1:
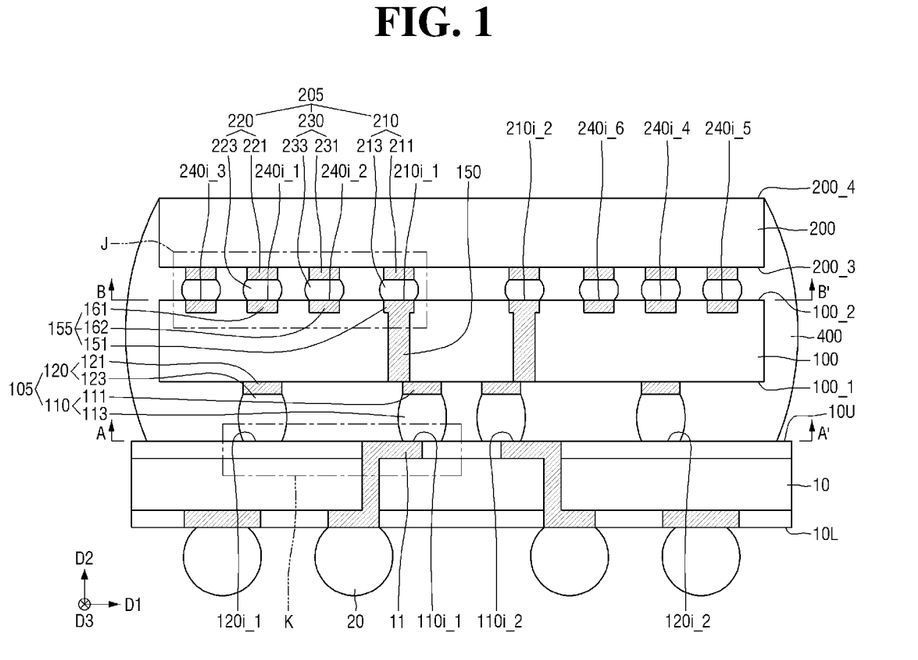
FIG. 1 is a cross-sectional view of a semiconductor package according to an exemplary embodiment of the present inventive concept.
Figure 2:
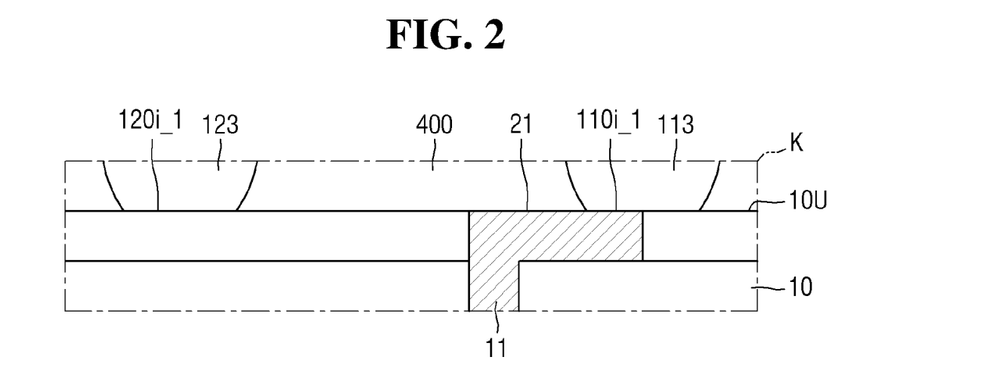
FIG. 2 is an enlarged view of a region k of FIG. 1, according to an exemplary embodiment of the present inventive concept.
Figure 3:
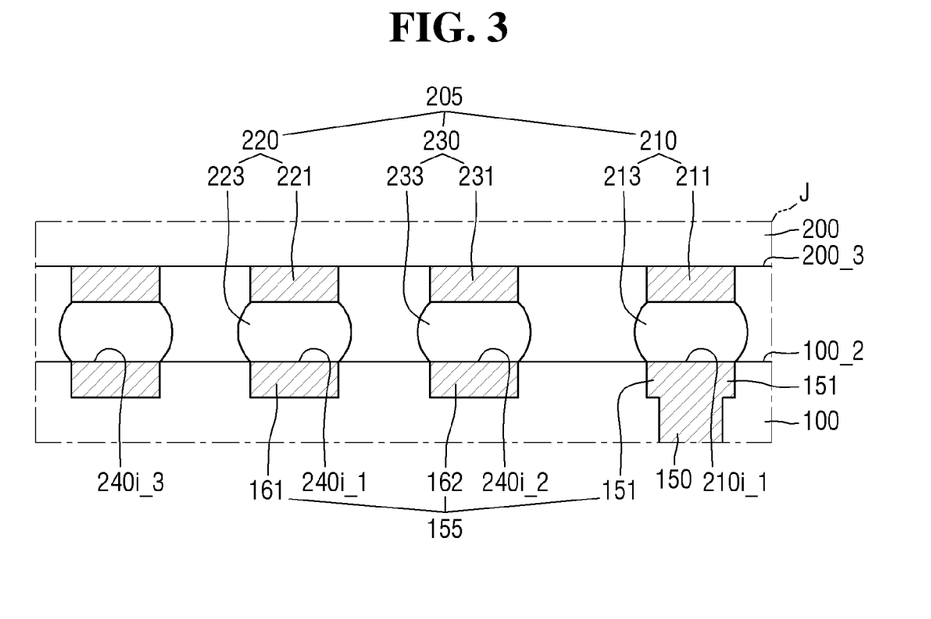
FIG. 3 is an enlarged view of a region j of FIG. 1, according to an exemplary embodiment of the present inventive concept.

FIG. 1 is a cross-sectional view of a semiconductor package according to some embodiments of the present inventive concept. FIG. 2 is an enlarged view of a region k of FIG. 1, according to an exemplary embodiment of the present inventive concept. FIG. 3 is an enlarged view of a region j of FIG. 1, according to an exemplary embodiment of the present inventive concept.

Referring to FIGS. 1 to 3, a semiconductor package according to an exemplary embodiment of the present inventive concept may include a package substrate 10, a first semiconductor chip 100, a second semiconductor chip 200, a plurality of first connection terminals 105, which may include a first signal connection terminal 110 and a first dummy connection terminal 120, a plurality of second connection terminals 205, which may include a second signal connection terminal 210, a second dummy connection terminal 220, and a third dummy connection terminal 230, and a molding material 400 as explained further below.

The package substrate 10 may be a substrate for package, and may be, for example, a printed circuit board (PCB) or a ceramic substrate. The package substrate 10 may include an upper surface 10U and a lower surface 10L opposite to each other.

The substrate pad 11 may extend through the package substrate 10 from the upper surface 10U of the package substrate 10 to the lower surface 10L of the package substrate 10. The substrate pad 11 may electrically connect an external connection terminal 20 and the first signal connection terminal 110.

The external connection terminal 20 may be attached to the lower surface 10L of the package substrate 10. In the drawings, the external connection terminal 20 is illustrated to have a fixed number, but the present inventive concept is not limited thereto. For example, if necessary, an arbitrary number of external connection terminals 20 may, of course, be attached to the lower surface 10L of the package substrate 10.

The external connection terminal 20 may be, but is not limited to, a conductive ball or a solder ball. The external connection terminal 20 may be, for example, a conductive bump, a conductive spacer and a pin grid array (PGA). A semiconductor package according to an exemplary embodiment of the present inventive concept may electrically connect to an external device via the external connection terminal 20.

The first semiconductor chip 100 may be disposed on the package substrate 10. The first semiconductor chip 100 may include a first surface 100_1 and a second surface 100_2 opposite to each other. The first surface 100_1 of the first semiconductor chip 100 may be a region on which a circuit of a semiconductor element is formed. The first semiconductor chip 100 may be in the form of, for example, a flip chip.

The first semiconductor chip 100 may include a first via 150 passing through the first semiconductor chip 100. The first via 150 may electrically connect the first semiconductor chip 100 and the second semiconductor chip 200.

The first semiconductor chip 100 may include the plurality of first connection terminals 105 disposed on the first surface 100_1, and a plurality of pads 155 disposed on the second surface 100_2. In detail, the plurality of pads 155 may include a first via pad 151, a second dummy pad 161, and a third dummy pad 162 as shown in FIG. 1 and will be explained further below.

The plurality of first connection terminals 105 may be disposed between the first surface 100_1 of the first semiconductor chip 100 and the upper surface 10U of the package substrate 10. For example, the plurality of first connection terminals 105 may contact the upper surface 10U of the package substrate 10. As discussed above, the plurality of first connection terminals 105 may include the first signal connection terminal 110 and the first dummy connection terminal 120.

The first signal connection terminal 110 may contact the upper surface 10U of the package substrate 10. The first signal connection terminal 110 may electrically connect the first semiconductor chip 100 and the package substrate 10. The first signal connection terminal 110 may, for example, electrically connect to the substrate pad 11 to electrically connect the external connection terminal 20 and the first semiconductor chip 100. In FIG. 1, the first signal connection terminal 110 is disposed so as not to completely overlap the upper surface 21 (FIG. 2) of the substrate pad 11, but the present inventive concept is not limited thereto. For example, the first signal connection terminal 110 may be disposed to completely overlap the upper surface 21 of the substrate pad 11. In addition, the first signal connection terminal 110 may electrically connect to the first via 150.

The first signal connection terminal 110 may include, for example, a first signal pad 111 and a first signal bump 113.

The first signal bump 113, for example, may contact the upper surface 10U of the package substrate 10. The first signal bump 113, for example, may contact the substrate pad 11.

The first signal pad 111 may be disposed between the first surface 100_1 of the first semiconductor chip 100 and the first signal bump 113. The first signal bump 113 of the first signal connection terminal 110 may be, for example, a conductive bump. However, the present inventive concept is not limited thereto. For example, the first signal bump 113 may be, for example, a solder ball capable of electrically connecting the package substrate 10 and the first semiconductor chip 100.

The first dummy connection terminal 120 may be spaced apart from the first signal connection terminal 110. The first dummy connection terminal 120 may contact the upper surface 10U of the package substrate 10. However, the first dummy connection terminal 120 may not electrically connect the first semiconductor chip 100 and the package substrate 10. The first dummy connection terminal 120, for example, may not electrically connected to the substrate pad 11. The first dummy connection terminal 120 may not be electrically connected to the first via 150.

The first dummy connection terminal 120 may include, for example, a first dummy pad 121 and a first dummy bump 123.

The first dummy bump 123, for example, may contact the upper surface 10U of the package substrate 10. The first dummy bump 123 may not be in contact with the substrate pad 11.

The first dummy pad 121 may be interposed between the first surface 100_1 of the first semiconductor chip 100 and the first dummy bump 123. For example, the first dummy bump 123 of the first dummy connection terminal 120 may be a conductive bump. However, the present inventive concept is not limited thereto. For example, the first dummy bump 123 may be in various forms such as a solder ball capable of physically connecting the first semiconductor chip 100 and the package substrate 10.

As discussed above, the plurality of pads 155 may include a first via pad 151, a second dummy pad 161, and a third dummy pad 162.

The first via pad 151 may be disposed on the second surface 100_2 of the first semiconductor chip 100. The first via pad 151 may be interconnected with the first via 150.

The second dummy pad 161 and the third dummy pad 162 may be disposed on the second surface 100_2 of the first semiconductor chip 100. The second dummy pad 161 and the third dummy pad 162 may be spaced apart from the first via pad 151.

The second semiconductor chip 200 may be disposed on the first semiconductor chip 100. The second semiconductor chip 200 may include a third surface 200_3 and a fourth surface 200_4 opposite to each other. The third surface 200_3 of the second semiconductor chip 200 may be a region in which a semiconductor element circuit is formed. The second semiconductor chip 200 may be in the form of, for example, a flip chip.

The second semiconductor chip 200 may include a plurality of second connection terminals 205 disposed on the third surface 200_3.

The plurality of second connection terminals 205 may be interposed between the third surface 200_3 of the second semiconductor chip 200 and the second surface 100_2 of the first semiconductor chip 100. For example, each of the plurality of second connection terminals 205 may overlie the second surface 100_2 of the first semiconductor chip 100. For example, each of the plurality of second connection terminals 205 may contact a plurality of pads 155 disposed on the second surface 100_2 of the first semiconductor chip 100.

The second signal connection terminal 210 may overlie the second surface 100_2 of the first semiconductor chip 100. For example, the second signal connection terminal 210 may contact the first via pad 151. In other words, the second signal connection terminal 210 may electrically connect to the first via 150 via the first via pad 151. The second signal connection terminal 210 may electrically connect the first semiconductor chip 100 and the second semiconductor chip 200. The second signal connection terminal 210 may electrically connect to the external connection terminal 20, for example, via the first via pad 151, the first via 150, the first signal connection terminal 110, and the substrate pad 11.

The second signal connection terminal 210 may include, for example, a second signal pad 211 and a second signal bump 213.

The second signal bump 213 may overlie, for example, the second surface 100_2 of the first semiconductor chip 100. The second signal bump 213 may contact, for example, the first via pad 151.

The second signal pad 211 may be interposed between the third surface 200_3 of the second semiconductor chip 200 and the second signal bump 213. The second signal bump 213 of the second signal connection terminal 210 may be, for example, a conductive bump. However, the present inventive concept is not limited thereto. For example, the second signal bump 213 may be, for example, a solder ball capable of electrically connecting the second semiconductor chip 200 to the first semiconductor chip 100.

The second dummy connection terminal 220 and the third dummy connection terminal 230 may be spaced apart from the second signal connection terminal 210. In addition, the second dummy connection terminal 220 and the third dummy connection terminal 230 may be spaced apart from each other, and may be interposed between the second surface 100_2 of the first semiconductor chip 100 and the third surface 200_3 of the second semiconductor chip 200. The second dummy connection terminal 220 and the third dummy connection terminal 230 may overlie the second surface 100_2 of the first semiconductor chip 100. However, the second dummy connection terminal 220 and the third dummy connection terminal 230 may not electrically connect the second semiconductor chip 200 and the first semiconductor chip 100.

The second dummy connection terminal 220 may contact the second dummy pad 161. The third dummy connection terminal 230 may contact the third dummy pad 162. The second dummy connection terminal 220 and the third dummy connection terminal 230 may not electrically connect to the first dummy connection terminal 120. The second dummy connection terminal 220 and the third dummy connection terminal 230 may not electrically connect to the first via 150.

The second dummy connection terminal 220 may include, for example, a fourth dummy pad 221 and a second dummy bump 223. The third dummy connection terminal 230 may include, for example, a fifth dummy pad 231 and a third dummy bump 233.

The second dummy bumps 223 and the third dummy bumps 233 may overlie, for example, the second surface 100_2 of the first semiconductor chip 100. The second dummy bump 223 and the third dummy bump 233, for example, may not be in contact with the first via pad 151.

The fourth dummy pad 221 may be interposed between the third surface 200_3 of the second semiconductor chip 200 and the second dummy bump 223. The fifth dummy pad 231 may be interposed between the third surface 200_3 of the second semiconductor chip 200 and the third dummy bump 233. The second dummy bump 223 and the third dummy bump 233 may be, for example, a conductive bump. However, the present inventive concept is not limited thereto. For example, the second dummy bump 223 and the third dummy bump 233 may be in a variety of forms, such as a solder ball, capable of physically connecting the second semiconductor chip 200 and the first semiconductor chip 100.

In an exemplary embodiment, in plan view, at least a part of the first dummy connection terminal 120 may overlap one of the second dummy connection terminal 220 and the third dummy connection terminal 230 vertically (e.g., in a second direction D2), on the base of the upper surface 10U of the package substrate 10.

For example, at least a part of the first dummy connection terminal 120 and at least a part of the second dummy connection terminal 220 may overlap vertically (e.g., in the second direction D2), on the base of the upper surface 10U of the package substrate 10. On the other hand, the first dummy connection terminal 120 may not overlap the third dummy connection terminal 230 vertically (e.g., in the second direction D2), on the base of the upper surface 10U of the package substrate 10.

A molding material 400 may fill a space between the first semiconductor chip 100 and the package substrate 10. The molding material 400 may surround the side surface of the first semiconductor chip 100 which connects the first surface 100_1 and the second surface 100_2 of the first semiconductor chip. The molding material 400 may also fill the space between the first semiconductor chip 100 and the second semiconductor chip 200. The molding material 400 may surround the side surface of the second semiconductor chip 200 which connects the third surface 200_3 and the fourth surface 200_4 of the second semiconductor chip 200.

In FIG. 1, the molding material 400 is illustrated not to be formed on the fourth surface 200_4 of the second semiconductor chip 200. However, the present inventive concept is not limited thereto. For example, the molding material 400 may, of course, be formed on the fourth surface 200_4 of the second semiconductor chip 200, depending on the manufacturing process of the semiconductor package. Further, for example, the molding material 400 may surround a portion of the side surface of the second semiconductor chip 200, depending on the manufacturing process of the semiconductor package. The molding material 400 may insulate the plurality of first connection terminals 105 and the plurality of second connection terminals 205 from each other.

In an exemplary embodiment, the molding material 400 may be, for example, a nonconductive film (NCF). However, the present inventive concept is not limited thereto. For example, the molding material 400 may include a material capable of insulating a plurality of first connection terminals 105 and a plurality of second connection terminals 205 from each other.

The semiconductor package according to an exemplary embodiment of the present inventive concept may include a first dummy connection terminal 120, a second dummy connection terminal 220, and a third dummy connection terminal 230, in addition to the first signal connection terminal 110 and the second signal connection terminal 210 connected to the first via 150 to provide a path through which the signal is transmitted.

In an exemplary embodiment, as illustrated in FIG. 1, when the first signal connection terminal 110 is not arranged with (e.g., not fully overlapped with) the second signal connection terminal 210 in the second direction D2, in order to balance the force applied to the first semiconductor chip 100 by the second semiconductor chip 200 and the force applied to the package substrate 10 by the first semiconductor chip 100, the semiconductor page according to an exemplary embodiment of the present inventive concept may include a first dummy connection terminal 120, a second dummy connection terminal 220, and a third dummy connection terminal 230.

At this time, the first dummy connection terminal 120 may provide a physical connection between the package substrate 10 and the first semiconductor chip 100. Further, the second dummy connection terminal 220 and the third dummy connection terminal 230 may provide a physical connection between the first semiconductor chip 100 and the second semiconductor chip 200. In an exemplary embodiment, the first dummy connection terminal 120 may be vertically aligned with either the second dummy connection terminal 220 or the third dummy connection terminal 230.

As a result, the force applied to the first semiconductor chip 100 by the second semiconductor chip 200 and the force applied to the package substrate 10 by the first semiconductor chip 100 may be substantially balanced. Therefore, according to an exemplary embodiment of the present inventive concept, it is possible to reduce the phenomenon in which the first semiconductor chip 100 and the second semiconductor chip 200 are inclined, due to an imbalance between the force received by the plurality of second connection terminals 205 and the force received by the plurality of first connection terminals 105.

Figure 4:
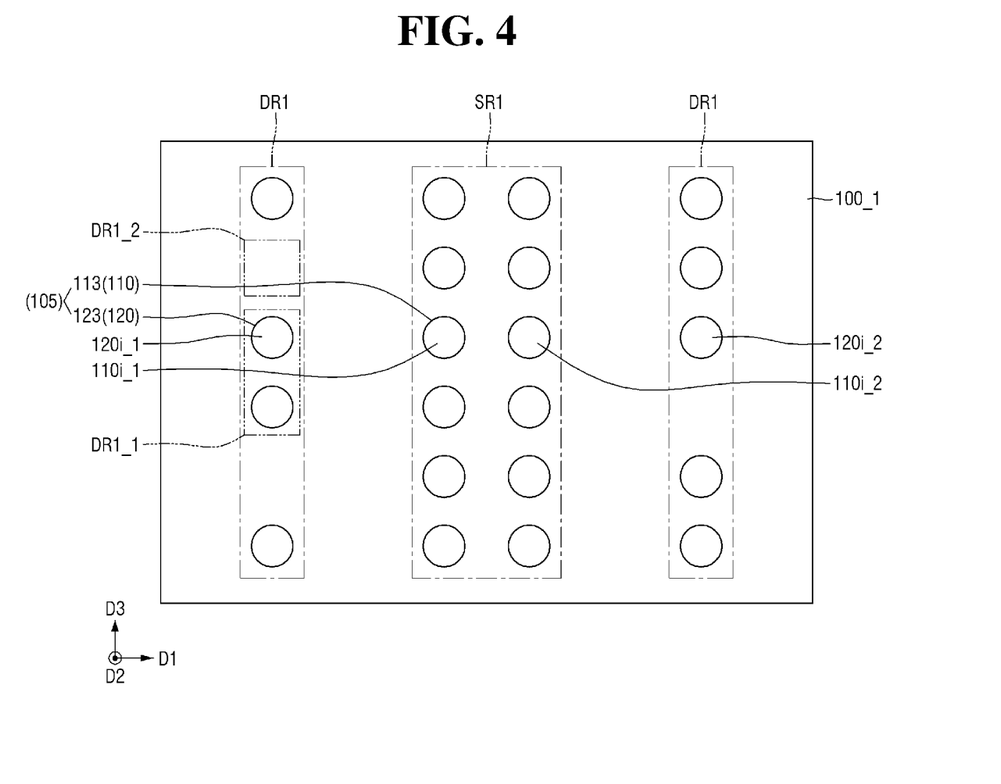
FIG. 4 is a cross-sectional view taken along a line A-A' of FIG. 1, according to an exemplary embodiment of the present inventive concept.
Figure 5:
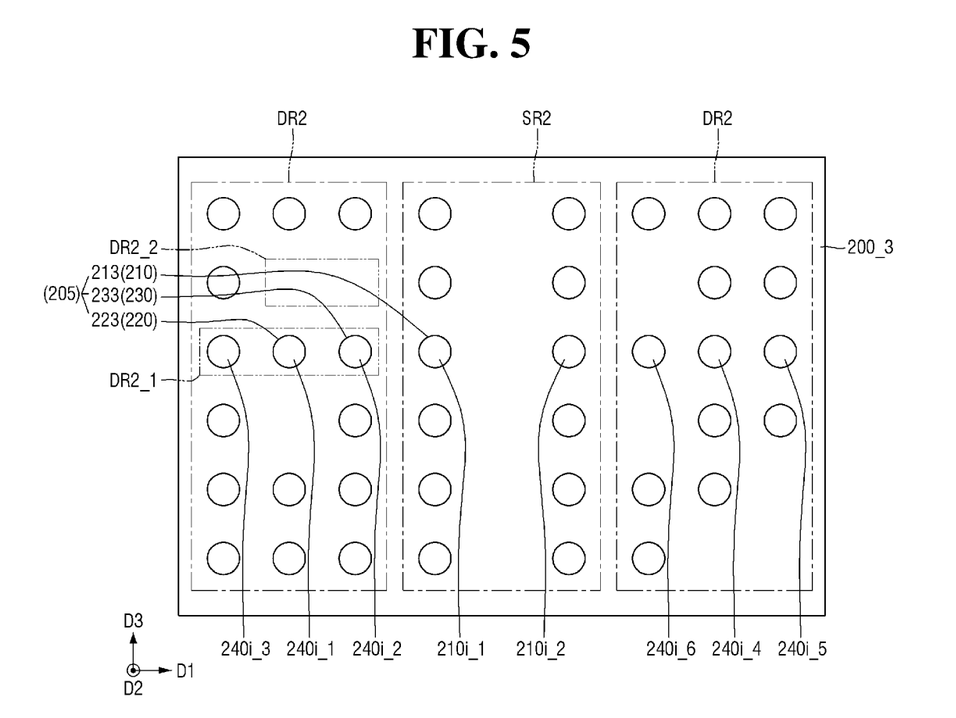
FIG. 5 is a cross-sectional view taken along a line B-B' of FIG. 1, according to an exemplary embodiment of the present inventive concept.

FIG. 4 is a cross-sectional view taken along the line A-A' of FIG. 1, and FIG. 5 is a cross-sectional view taken along the line B-B' of FIG. 1. In FIGS. 4 and 5, the illustration of the molding material 400 is omitted for clarity of illustration. Further, the line A-A' in FIG. 1 may be a line illustrating a boundary on which the upper surface 10U of the package substrate 10 contacts the plurality of first connection terminals 105. The line B-B' in FIG. 1 may be a line illustrating a boundary on which the second surface 100_2 of the first semiconductor chip 100 contacts the plurality of second connection terminals 205.

Referring to FIGS. 1 and 4, the first surface 100_1 of the first semiconductor chip 100 has a first signal region SR1 in which the first signal connection terminal 110 is formed, and a first dummy region DR1 in which the first dummy connection terminal 120 is formed.

The first signal connection terminal 110 may be disposed in the first signal region SR1. The first signal connection terminal 110 may be disposed along the first direction D1 and the third direction D3. In the drawings, the first signal connection terminals 110 with an arbitrary number are illustrated to be aligned in two rows, but the present inventive concept is not limited thereto. For example, the first signal connection terminal 110 may be aligned in various forms with various numbers as necessary.

The first dummy connection terminal 120 may be disposed in the first dummy region DR1. The first dummy connection terminal 120 may be spaced apart from the first signal connection terminal 110 in the first direction D1. The first dummy region DR1 may include a region DR1_1 in which the first dummy connection terminal 120 is disposed, and a region DR1_2 in which the first dummy connection terminal 120 is not disposed.

In an exemplary embodiment, a first area may be the sum of the areas $110i\_1$, $110i\_2$, $120i\_1$, and $120i\_2$ in which the plurality of first connection terminals 105 contact the upper surface 10U of the package substrate.

Specifically, the first area may be, for example, the sum of the areas $110i\_1$ and $110i\_2$ in which the first signal connection terminal 110 contacts the upper surface 10U of the package substrate 10, and the areas $120i\_1$ and $120i\_2$ in which the first dummy connection terminal 120 contacts the upper surface 10U of the package substrate 10. For example, the first area may be a value measured at the boundary on which the first signal bump 113 and the first dummy bump 123 are in contact with the upper surface 10U of the package substrate 10.

In some embodiments, throughout the specification, the first area may include regions where the upper surfaces 21 of the substrate pad 11 are in contact with the first signal bump 113 and the first dummy bump 123.

For example, in FIG. 4, a total of twenty-one of the first signal connection terminals 110 and the first dummy connection terminals 120 may be disposed. For example, assuming that the area in which the first signal connection terminal 110 contacts the upper surface 10U of the package substrate 10 is, for example, 5 (AU, Arbitrary Unit), and the area in which the first dummy connection terminal 120 contacts the upper surface 10U of the package substrate 10 is also, for example, 5(AU), the first area in FIG. 4 may be 105 (AU).

Referring to FIGS. 1 and 5, the third surface 200_3 of the second semiconductor chip 200 may include a second signal region SR2 in which the second signal connection terminal 210 is formed, and a second dummy region DR2 in which the second dummy connection terminal 220 and the third dummy connection terminal 230 are formed.

The second signal connection terminal 210 may be disposed in the second signal region SR2. The second signal connection terminal 210 may be aligned along the first direction D1 and the third direction D3. In the drawings, the second signal connection terminals 210 with an arbitrary number are illustrated to be aligned in two rows, but the present inventive concept is not limited thereto. For example, the second signal connection terminal 210 may be disposed in various forms with various numbers, if necessary.

The second dummy connection terminal 220 and the third dummy connection terminal 230 may be disposed in the second dummy region DR2. The second dummy connection terminal 220 and the third dummy connection terminal 230 may be spaced apart from the second signal connection terminal 210 in the first direction D1. The second dummy region DR2 may include a region DR2_1 in which the second dummy connection terminal 220 and the third dummy connection terminal 230 are disposed, and a region DR2_2 in which the second dummy connection terminal 220 and the third dummy connection terminal 230 are not disposed.

In some embodiments, a second area may be the sum of the areas 210*i* 1, 210*i* 2, 240*i* 1, 240*i* 2, 240*i* 3, 240*i* 4, 240*i* 5, and 240*i*_6 in which the plurality of second connection terminals 205 contact the second surface 100_2 of the first semiconductor chip 100. The second area may include regions where the plurality of second connection terminals 205 contact corresponding ones of upper surfaces of the plurality of pads 155. Alternatively, it can be said that the second area may be the sum of the areas 210*i* 1, 210*i* 2, 240*i* 1, 240*i* 2, 240*i* 3, 240*i*_4, 240*i*_5, and 240*i*_6 in which the plurality of second connection terminals 205 contact the first semiconductor chip 100.

The second area may be, for example, the sum of the areas 210*i*_1 and 210*i*_2 in which the second signal connection terminal 210 contacts the second surface 100_2 of the first semiconductor chip 100 and the areas 240*i*_1, 240*i*_2, 240*i*_3, 240*i*_4, 240*i*_5, and 240*i*_6 in which the second dummy connection terminal 220 and the third dummy connecting terminal 230 are in contact with the second surface 100_2 of the first semiconductor chip 100. The second area may be, for example, a value measured in a boundary in which the second signal bump 213, the second dummy bump 223, and the third dummy bump 233 are in contact with the second surface 100_2 of the first semiconductor chip 100.

For example, in FIG. 5, a total of forty of the second signal connection terminals 210, the second dummy connection terminals 220 and the third dummy connection terminals 230 may be disposed. Assuming that the area in which the second signal connection terminal 210 contacts the second surface 100_2 of the first semiconductor chip 100 is, for example, 2(AU), and the area in which each of the second dummy connection terminal 220 and the third dummy connection terminal 230 contacts the second surface 100_2 of the first semiconductor chip 100 is also, for example, 2(AU), the second area in FIG. 5 may be 80(AU).

In the semiconductor package according to an exemplary embodiment of the present inventive concept, an absolute value of a difference between the first area and the second area may be equal to or less than about 0.3 of the first area. For example, when the first area in FIG. 4 is 105(AU) and the second area in FIG. 5 is 80 (AU), the absolute value of the difference between the first area and the second area may be 25 (AU). In the present embodiment, the absolute value of the difference between the first area and the second area is equal to or less than about 0.3 (31.5 (AU)) of the first area.

When the absolute value of the difference between the first area and the second area is equal to or less than about 0.3 of the first area, the force applied to the first semiconductor chip 100 by the second semiconductor chip 200, and the force applied to the package substrate 10 by the first semiconductor chip 100 may be substantially balanced. In other words, if the absolute value of the difference between the first area and the second area is equal to or less than about 0.3 of the first area, the force received by the plurality of second connection terminals 205 and the force received by the plurality of first connection terminals 105 may be substantially balanced. Accordingly, the semiconductor package according to an exemplary embodiment of the present inventive concept may ensure uniform bonding quality, and may prevent the phenomenon in which the first semiconductor chip 100 and the second semiconductor chip 200 are inclined.

TABLE 1

| | | In the case of A | | In the case of B | |
| --- | --- | --- | --- | --- | --- |
| | | Signal connection terminal | Dummy connection terminal | Signal connection terminal | Dummy connection terminal |
| Plurality of first connection terminals | Number of plurality of first connection terminals (unit: ea) | 159 | 0 | 159 | 234 |
| | Force received by each of the plurality of first connection terminals | 73 MPa (35 N reference) | | 41 MPa (35 N reference) | |
| Plurality of second connection terminals | Number of plurality of second connection terminals (unit: ea) | 197 | 0 | 197 | 756 |
| | Force received by each of the plurality of second connection terminals | 226 MPa (35 N reference) | | 47 MPa (35 N reference) | |

Table 1 shows a result obtained by comparing a case (in the case of A) where the absolute value of the difference between the first area and the second area exceeds about 0.3 of the first area with a case (in the case of B) where the absolute value of the difference between the first area and the second area is equal to or less than about 0.3 of the first area.

Referring to Table 1, when the force of 35N is applied to the second semiconductor chip 200 in a state in which the first semiconductor chip 100 and the second semiconductor chip 200 are stacked on the package substrate 10, in the case of A, since the force received by each of the plurality of first connection terminals 105 is 73 MPa and the force received by each of the plurality of second connection terminals 205 is 226 MPa, it is possible to know that there is a difference of about 3 times.

On the other hand, in the case of B, since the force received by each of the plurality of first connection terminals 105 is 41 MPa and the force received by each of the plurality of second connection terminals 205 is 47 MPa, it is possible to know that difference is very small as compared with the case of A.

In the case of B, since the difference between the force received by the plurality of first connection terminals 105 and the force received by the plurality of second connection terminals 205 is relatively small, the phenomenon in which the first semiconductor chip 100 and the second semiconductor chip 200 are inclined can be reduced.

On the other hand, if the absolute value of the difference between the first area and the second area is equal to or less than about 0.3 of the first area, each of the number of the first dummy connection terminals 120, the number of the second dummy connection terminals 220, and the number of third dummy connection terminals 230 may have any number.

In an exemplary embodiment, the total number of the plurality of first connection terminals 105 and the total number of the plurality of second connection terminals 205 may be different from each other. In an exemplary embodiment, the total number of the plurality of second connection terminals 205 may be greater than the total number of the plurality of first connection terminals 105.

For example, in order to set the absolute value of the difference between the first area and the second area to be about 0.3 or less of the first area on the base of the first area, the area of the region DR1_2 of FIG. 4 in which the first dummy connection terminal 120 is not formed, and the area of the region DR2_2 of FIG. 5 in which the second dummy connection terminal 220 and the third dummy connection terminal 230 are not formed may be increased or decreased.

Further, the arrangement of the region DR1_1 in which the first dummy connection terminal 120 is formed in FIG. 4, and the arrangement of the region DR2_1 in which the second dummy connection terminal 220 and the third dummy connection terminal are formed in FIG. 5 may not coincide with each other. However, as described above, in an exemplary embodiment, at least a portion of the first dummy connection terminal 120 may overlap at least a portion of one of the second dummy connection terminal 220 and the third dummy connection terminal 230 in the third direction D3.

Hereinafter, the semiconductor package according to another exemplary embodiment of the present inventive concept will be described with reference to FIGS. 6 to 8. For the sake of clarity of explanation, repeated description will not be provided.

Figure 6:
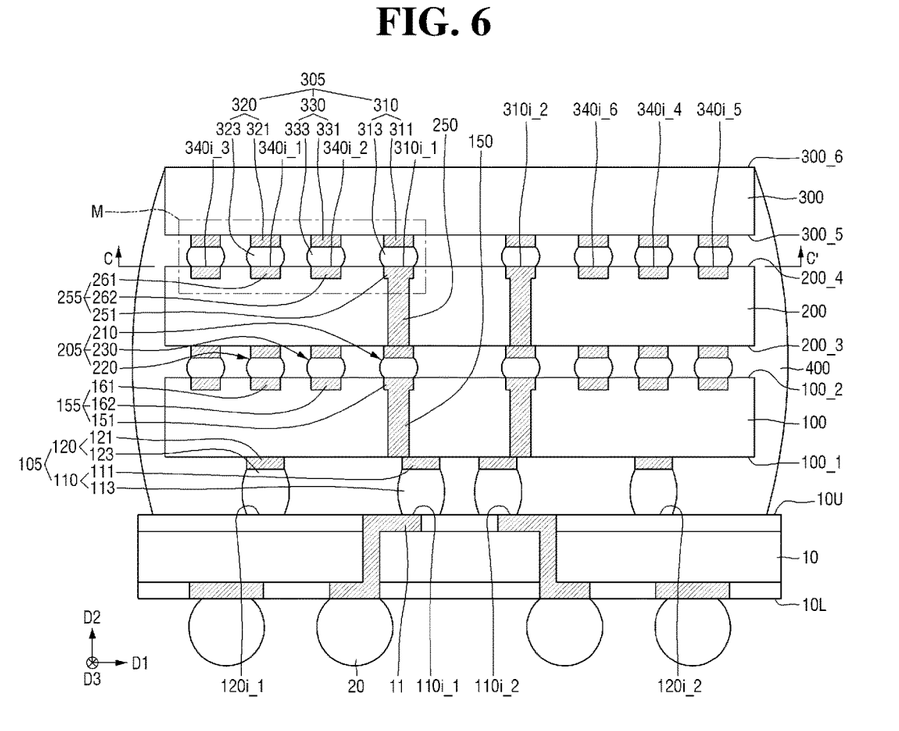
FIG. 6 is a cross-sectional view of a semiconductor package according to an exemplary embodiment of the present inventive concept.

FIG. 6 is a cross-sectional view of a semiconductor package according to another exemplary embodiment of the present inventive concept. FIG. 7 is an enlarged view of a region m of FIG. 6.

Figure 7:
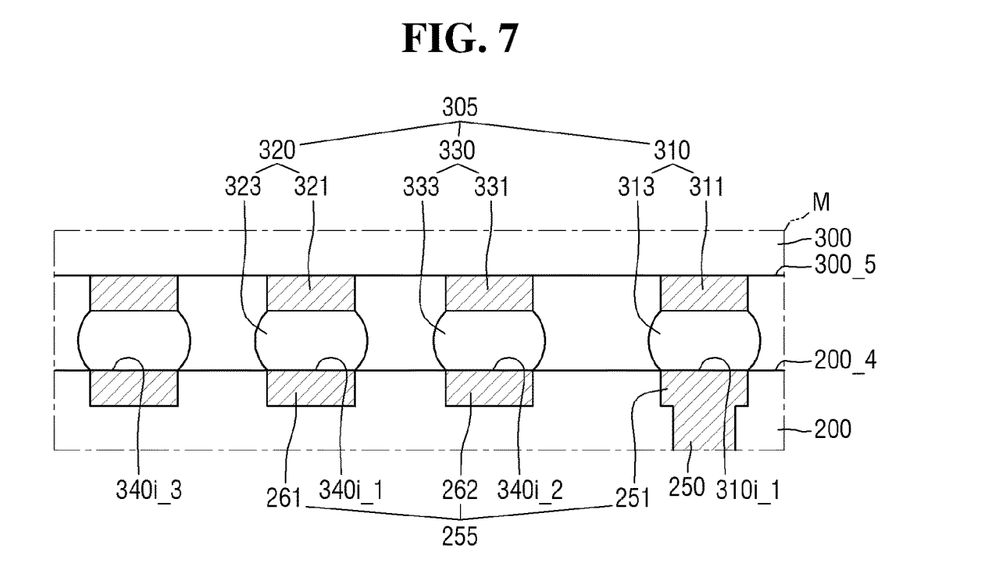
FIG. 7 is an enlarged view of a region m of FIG. 6, according to an exemplary embodiment of the present inventive concept.

Referring to FIGS. 6 and 7, the semiconductor package according to an exemplary embodiment of the present inventive concept may further include a third semiconductor chip 300.

The second semiconductor chip 200 may further include a second via 250 passing through the second semiconductor chip 200. The third semiconductor chip 300, the second semiconductor chip 200, and the first semiconductor chip 100 may electrically connect to each other via the second via 250. The second via 250 may electrically connect to the second signal connection terminal. The second via 250 may not electrically connect to the second dummy connection terminal 220 and the third dummy connection terminal 230.

The second semiconductor chip 200 may further include a plurality of pads 255 disposed on a fourth surface 200_4 of the second semiconductor chip 200.

The plurality of pads 255 may include a second via pad 251, a sixth dummy pad 261, and a seventh dummy pad 262.

The second via pad 251 may be disposed on the fourth surface 200_4 of the second semiconductor chip 200. The second via pad 251 may be interconnected with the second via 250.

The sixth dummy pad 261 and the seventh dummy pad 262 may be disposed on the fourth surface 200_4 of the second semiconductor chip 200. The sixth dummy pad 261 and the seventh dummy pad 262 may be spaced apart from the second via pad 251.

The third semiconductor chip 300 may overlie the second semiconductor chip 200. The third semiconductor chip 300 may include a fifth surface 300_5 and a sixth surface 300_6 opposite to each other. The fifth surface 300_5 of the third semiconductor chip 300 may be a region on which a semiconductor element circuit is formed. The third semiconductor chip 300, for example, may be a flip chip.

The third semiconductor chip 300 may include a plurality of third connection terminals 305 disposed on the fifth surface 300_5. The plurality of third connection terminals 305 may include a third signal connection terminal 310, a fourth dummy connection terminal 320, and a fifth dummy connection terminal 330.

The plurality of third connection terminals 305 may be interposed between the fifth surface 300_5 of the third semiconductor chip 300 and the fourth surface 200_4 of the second semiconductor chip 200. For example, the plurality of third connection terminals 305 may contact the fourth surface 200_4 of the second semiconductor chip 200. For example, each of the plurality of third connection terminals 305 may contact a corresponding one of a plurality of pads 255 disposed on the fourth surface 200_4 of the second semiconductor chip 200.

In some embodiments, the third signal connection terminal 310 may correspond to (e.g., vertically aligned with) the second signal connection terminal 210. That is, the third signal connection terminal 310 may electrically connect to the second via 250. The third signal connection terminal 310 may electrically connect the second semiconductor chip 200 and the third semiconductor chip 300.

The third signal connection terminal 310 may include, for example, a third signal pad 311 and a third signal bump 313.

The third signal pad 311 may correspond to the second signal pad (211 of FIG. 1). The third signal pad 311 may be, for example, substantially the same as the second signal pad (211 of FIG. 1).

The third signal bump 313 may correspond to the second signal bump (213 of FIG. 1). The third signal bump 313 may be, for example, substantially the same as the second signal bump (213 of FIG. 1).

The fourth dummy connection terminal 320 and the fifth dummy connection terminal 330 may be spaced apart from the third signal connection terminal 310. The fourth dummy connection terminal 320 may correspond to the second dummy connection terminal 220. The fifth dummy connection terminal 330 may correspond to the third dummy connection terminal 230.

The fourth dummy connection terminal 320 may include an eighth dummy pad 321 and a fourth dummy bump 323. The eighth dummy pad 321 may be substantially the same as, for example, the fourth dummy pad (221 of FIG. 1). The fourth dummy bump 323 may be substantially the same as, for example, the second dummy bump (223 of FIG. 1).

The fifth dummy connection terminal 330 may include a ninth dummy pad 331 and a fifth dummy bump 333. The ninth dummy pad 331 may be substantially the same as, for example, the fifth dummy pad (231 of FIG. 1). The fifth dummy bump 333 may be substantially the same as, for example, the third dummy bump (233 of FIG. 1).

The fourth dummy connection terminal 320 and the fifth dummy connection terminal 330 may not be electrically connected to the second via 250. The fourth dummy connection terminal 320 and the fifth dummy connection terminal 330 may not electrically connect the second semiconductor chip 200 and the third semiconductor chip 300.

In an exemplary embodiment, at least a part of the first dummy connection terminal 120 may vertically (e.g., in the second direction D2) overlap at least a part of the second dummy connection terminal 220 and at least a part of the fourth dummy connection terminal 320, on the base of the upper surface 10U of the package substrate 10. In other words, the first dummy connection terminal 120, the second dummy connection terminal 220 and the fourth dummy connection terminal 320 may be vertically aligned in the second direction D2.

Figure 8:
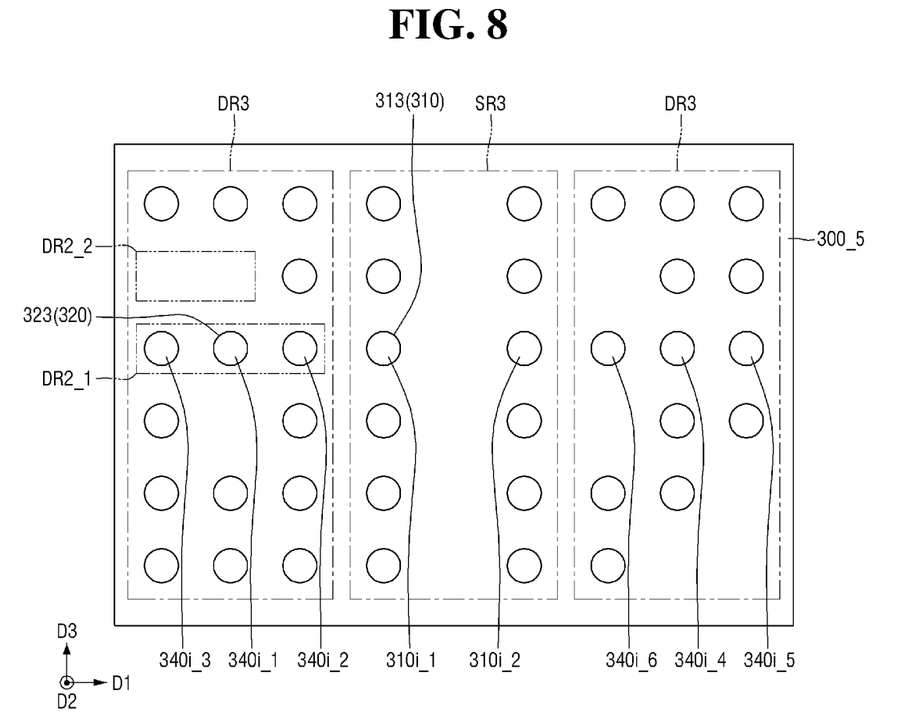
FIG. 8 is a cross-sectional view taken along a line C-C' of FIG. 6, according to an exemplary embodiment of the present inventive concept.

FIG. 8 is a cross-sectional view taken along the line C-C' of FIG. 6. In FIG. 8, the molding material 400 is not illustrated for the clarity of illustration. Further, the C-C' line in FIG. 6 may be a line indicating the boundary on which the fourth surface 200_4 of the second semiconductor chip 200 and the plurality of third connection terminals 305 are in contact with each other.

Referring to FIGS. 6 and 8, the fifth surface 300_5 of the third semiconductor chip 300 has a third signal region SR3 in which the third signal connection terminal 310 is formed, and a third dummy region DR3 in which a fourth dummy connection terminal 320 and a fifth dummy connection terminal 330 are formed.

The third signal connection terminal 310 may be disposed in the third signal region SR3. The third signal connection terminal 310 may be aligned along the first direction D1 and the third direction D3. In the drawings, the third signal connection terminals 310 with an arbitrary number are illustrated to be aligned in two rows, but the present inventive concept is not limited thereto. For example, the third signal connection terminal 310 may be disposed in various forms with various numbers as necessary.

The fourth dummy connection terminal 320 and the fifth dummy connection terminal 330 may be disposed in the third dummy region DR3. The fourth dummy connection terminal 320 and the fifth dummy connection terminal 330 may be spaced apart from the third signal connection terminal 310 in the first direction D1. The third dummy region DR3 may include a region DR3_1 in which the fourth dummy connection terminal 320 and the fifth dummy connection terminal 330 are disposed, and a region DR3_2 in which the fourth dummy connection terminal 320 and the fifth dummy connection terminal 330 are not disposed.

In an exemplary embodiment, a third area may be the sum of the areas $310i\_1$, $310i\_2$, $340i\_1$, $340i\_2$, $340i\_3$, $340i\_4$, $340i\_5$, and $340i\_6$ in which the plurality of third connection terminals 305 are in contact with the fourth surface 200_4 of the second semiconductor chip 200. The third area may include regions where the plurality of third connection terminals 305 contact corresponding ones of upper surfaces of the plurality of pads 255. Alternatively, it can be said that the third area may be the sum of the areas $310i\_1$, $310i\_2$, $340i\_1$, $340i\_2$, $340i\_3$, $340i\_4$, $340i\_5$, and $340i\_6$ in which the plurality of third connection terminals 305 are in contact with the second semiconductor chip 200.

The third area may be, for example, the sum of the areas $310i\_1$, $310i\_2$ in which the third signal connection terminal 310 contacts the fourth surface 200_4 of the second semiconductor chip 200, and the areas $340i\_1$, $340i\_2$, $340i\_3$, $340i\_4$, $340i\_5$, and $340i\_6$ in which the fourth dummy connection terminal 320 and the fifth dummy connection terminal 330 are in contact with the fourth surface 200_4 of the second semiconductor chip 200. Also see FIG. 7. The third area may be, for example, a value measured at a boundary on which the third signal bump 313, the fourth dummy bump 323, and the fifth dummy bump 333 are in contact with the fourth surface 200_4 of the second semiconductor chip 200.

For example, in FIG. 8, a total of forty of the third signal connection terminals 310, the fourth dummy connection terminals 320 and the fifth dummy connection terminals 330 may be disposed. Assuming that the area in which the third signal connection terminal 310 contacts the fourth surface 200_4 of the second semiconductor chip 200 is, for example, 2(AU), and the area in which each of the fourth dummy connection terminal 320 and the fifth dummy connection terminal 330 contacts the fourth surface 200_4 of the second semiconductor chip 200 is also, for example, 2(AU), the third area of FIG. 8 may be 80(AU).

In the semiconductor package according to an exemplary embodiment of the present inventive concept, the absolute value of the difference between the first area and the third area may be about 0.3 or less of the first area. For example, when the first area in FIG. 4 is 105(AU) and the third area in FIG. 8 is 80(AU), the absolute value of the difference between the first area and the second area may be 25 (AU). In the present embodiment, the absolute value of the difference between the first area and the second area is equal to or less than about 0.3 (31.5 (AU)) of the first area.

When the absolute value of the difference between the first area and the second area is equal to or less than about 0.3 of the first area and the absolute value of the difference between the first area and the third area is also equal to or less than about 0.3 of the first area, the force applied to the second semiconductor chip 200 by the third semiconductor chip 300 and the force applied to the first semiconductor chip 100 by the second semiconductor chip 200 may be substantially balanced.

In other words, if the absolute value of the difference between the first area and the third area is equal to or less than about 0.3 of the first area, the force received by the plurality of third connection terminals 305 may be substantially balanced with the force received by the plurality of first connection terminals 105 and the plurality of second connection terminals 205. Accordingly, the semiconductor package according to an exemplary embodiment of the present inventive concept may secure a uniform bonding quality, and may prevent a phenomenon in which the first semiconductor chip 100, the second semiconductor chip 200, and the third semiconductor chip 300 are inclined.

Hereinafter, the semiconductor package according to an exemplary embodiment of the present inventive concept will be described with reference to FIG. 9. For the sake of clarity of explanation, repeated description will not be provided.

Figure 9:
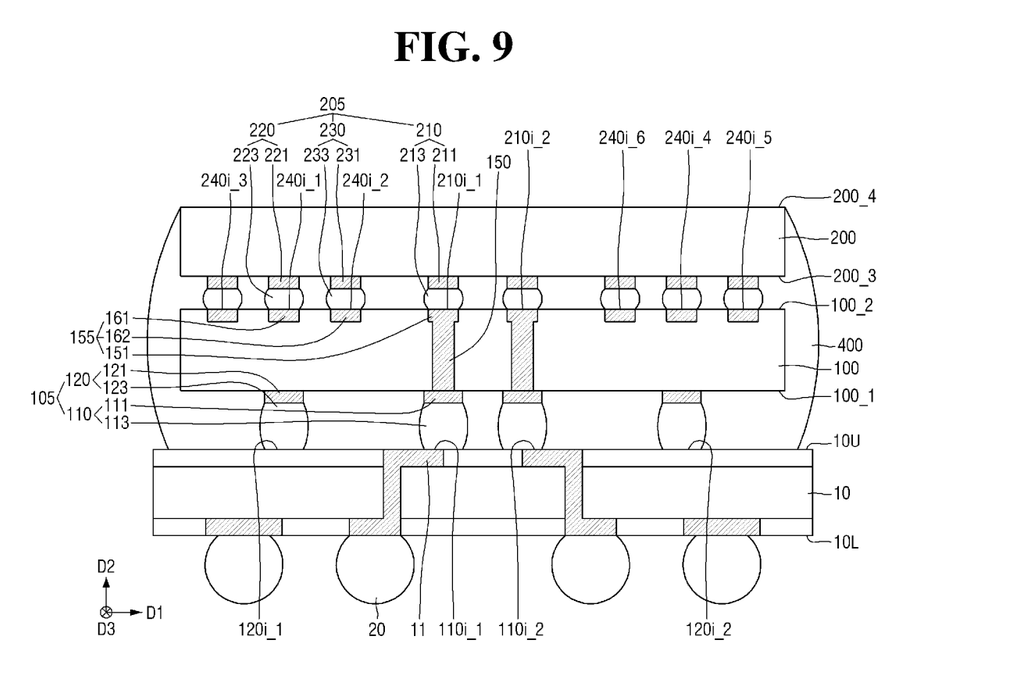
FIG. 9 is a cross-sectional view of a semiconductor package according to an exemplary embodiment of the present inventive concept.

FIG. 9 is a cross-sectional view of the semiconductor package according to an exemplary embodiment of the present inventive concept.

Referring to FIG. 9, the first signal connection terminal 110 and the second signal connection terminal 210 may be vertically aligned in the second direction D2.

Because of a difference in design rule, the size of the first signal connection terminal 110 and the size of the second signal connection terminal 210 may be different from each other. Specifically, the size of the first signal bump 113 may be larger than the size of the second signal bump 213.

The difference between the size of the first signal connection terminal 110 and the size of the second signal connection terminal 210 may be set such that the magnitude of the force received by the plurality of first connection terminals 105 is different from the magnitude of the force received by the plurality of second connection terminals 205.

At this time, when the absolute value of the difference between the first area and the second area is equal to or less than about 0.3 of the first area, the force received by the plurality of second connection terminals 205 and the force received by the plurality of first connection terminals 105 may be substantially balanced. Accordingly, the semiconductor package may ensure a uniform bonding quality, may substantially prevent the phenomenon in which the first semiconductor chip 100 and the second semiconductor chip 200 are inclined.

In some other embodiments, although the present inventive concepts have been described having a signal region in a central region of a semiconductor chip, the present inventive concepts may be applied to a semiconductor chip having a signal region in an edge region of a semiconductor with a dummy region located in a central region of a semiconductor chip.

Also, while there may be a single second semiconductor chip overlying a first semiconductor chip as shown in FIG. 6, a plurality of second semiconductor chips can be stacked over the first semiconductor chip.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:
1. A semiconductor package comprising:
a package substrate;
a first semiconductor chip disposed on the package substrate, the first semiconductor chip including a first surface and a second surface opposite to each other;
a plurality of first connection terminals disposed on the first surface of the first semiconductor chip and in contact with an upper surface of the package substrate;
a second semiconductor chip overlying the second surface of the first semiconductor chip, the second semiconductor chip including a third surface and a fourth surface opposite to each other; and
a plurality of second connection terminals disposed on the third surface of the second semiconductor chip and in contact with the second surface of the first semiconductor chip,
wherein an absolute value between a first area which is a sum of areas in which the plurality of first connection terminals contact the upper surface of the package substrate and a second area which is a sum of areas in which the plurality of second connection terminals contact the second surface of the first semiconductor chip is equal to or less than about 0.3 of the first area.

2. The semiconductor package of claim 1, wherein a total number of the plurality of first connection terminals and a total number of the plurality of second connection terminals are different from each other.

3. The semiconductor package of claim 2, wherein the total number of the plurality of second connection terminals is larger than the total number of the plurality of first connection terminals.

4. The semiconductor package of claim 1, wherein the first semiconductor chip comprises a first via passing therethrough,
wherein the plurality of first connection terminals comprises a first signal connection terminal electrically connected to the first via, and a first dummy connection terminal spaced apart from the first signal connection terminal, and
wherein the plurality of second connection terminals comprises a second signal connection terminal electrically connected to the first via, and second and third dummy connection terminals spaced apart from the second signal connection terminal.

5. The semiconductor package of claim 4, wherein the first, second and third dummy connection terminals are not electrically connected to the first via.

6. The semiconductor package of claim 4, wherein at least a portion of the first dummy connection terminals vertically overlaps at least a portion of the second dummy connection terminals, and
wherein the first dummy connection terminals do not vertically overlap the third dummy connection terminals.

7. The semiconductor package of claim 4, wherein the package substrate comprises an external connection terminal disposed on a lower surface of the package substrate, and a substrate pad disposed on an upper surface of the package substrate and connected to the external connection terminal,
wherein the first signal connection terminal is electrically connected to the substrate pad, and
wherein the first dummy connection terminal is not electrically connected to the substrate pad.

8. The semiconductor package of claim 1, wherein each of the plurality of first connection terminals comprises a first bump, and a first pad disposed between the first bump and the first surface of the first semiconductor chip, and
wherein the first area is a value measured at a boundary in which the first bump contacts the upper surface of the package substrate.

9. The semiconductor package of claim 8, wherein each of the plurality of second connection terminals comprises a second bump, and a second pad disposed between the second bump and the third surface of the second semiconductor chip, and wherein the second area is a value measured at a boundary in which the second bump contacts the second surface of the first semiconductor chip.

10. The semiconductor package of claim 1, further comprising:
   a third semiconductor chip disposed on the fourth surface of the second semiconductor chip, and includes a fifth surface and a sixth surface opposite to each other; and
   a plurality of third connection terminals disposed on the fifth surface of the third semiconductor chip and contact the fourth surface of the second semiconductor chip.

11. The semiconductor package of claim 10, wherein an absolute value of a difference between the first area and a third area is about 0.3 or less of the first area, the third area being a sum of areas in which the plurality of third connection terminals contact the fourth surface of the second semiconductor chip.

12. The semiconductor package of claim 10, wherein the second semiconductor chip comprises a second via passing therethrough,
   wherein the plurality of third connection terminals comprises a third signal connection terminal electrically connected to the second via, and a fourth dummy connection terminal spaced apart from the third signal connection terminal, and
   wherein the fourth dummy connection terminal is not electrically connected to the second via.

13. A semiconductor package comprising:
   a package substrate;
   a first semiconductor chip disposed on a package substrate, the first semiconductor chip including a first surface and a second surface opposite to each other;
   a first signal connection terminal disposed between the first surface of the first semiconductor chip and an upper surface of the package substrate, the first signal connection terminal electrically connecting the first semiconductor chip and the package substrate;
   a first dummy connection terminal interposed between the first surface of the first semiconductor chip and the upper surface of the package substrate, the first dummy connection terminal spaced apart from the first signal connection terminal;
   a second semiconductor chip overlying the second surface of the first semiconductor chip, the second semiconductor chip including a third surface and a fourth surface opposite to each other;
   a second signal connection terminal disposed between the third surface of the second semiconductor chip and the second surface of the first semiconductor chip, the second signal connection terminal electrically connecting the first semiconductor chip and the second semiconductor chip; and
   a second dummy connection terminal and a third dummy connection terminal which are disposed between the third surface of the second semiconductor chip and the second surface of the first semiconductor chip, the second dummy connection terminal and the third dummy connection terminal spaced apart from the second signal connection terminal,
   wherein at least a portion of the first dummy connection terminal and at least a portion of the second dummy connection terminal vertically overlap each other, and the first dummy connection terminal and the third dummy connection terminals does not vertically overlap each other;
   wherein a first area is a sum of an area in which the first signal connection terminal contacts the upper surface of the package substrate, and an area in which the first dummy connection terminal contacts the upper surface of the package substrate,
   wherein a second area is a sum of an area in which the second signal connection terminal contacts the second surface of the first semiconductor chip, an area in which the second dummy connection terminal contacts the second surface of the first semiconductor chip, and an area in which the third dummy connection terminal contacts the second surface of the first semiconductor chip,
   wherein the first area and the second area are different each other, and
      wherein an absolute value of a difference between the first area and the second area is about 0.3 or less of the first area.

14. The semiconductor package of claim 13, wherein the first dummy connection terminal does not electrically connect the package substrate and the first semiconductor chip, and
   wherein the second and third dummy connection terminals do not electrically connect the first semiconductor chip and the second semiconductor chip.

15. The semiconductor package of claim 13, further comprising:
   a third semiconductor chip overlying the fourth surface of the second semiconductor chip, the third semiconductor chip including a fifth surface and a sixth surface opposite to each other;
   a third signal connection terminal interposed between the fifth surface of the third semiconductor chip and the fourth surface of the second semiconductor chip, the third signal connection terminal electrically connecting the second semiconductor chip and the third semiconductor chip; and
   a fourth dummy connection terminal interposed between the fifth surface of the third semiconductor chip and the fourth surface of the second semiconductor chip, and spaced apart from the third signal connection terminal.

16. The semiconductor package of claim 15,
   wherein a third area is a sum of an area in which the third signal connection terminal contacts the fourth surface of the second semiconductor chip, and an area in which the fourth dummy connection terminal contacts the fourth surface of the second semiconductor chip, and
      wherein an absolute value of a difference between the first area and the third area is about 0.3 or less of the first area.

17. A semiconductor package comprising:
   a package substrate including a substrate pad on an upper surface thereof;
   a first signal connection terminal electrically connected to the substrate pad;
   a first dummy connection terminal spaced apart from the substrate pad and the first signal connection terminal and disposed on the package substrate;
   a first semiconductor chip disposed on the first dummy connection terminal and the first signal connection terminal, the first semiconductor chip including a first via electrically connected to the first signal connection terminal;
   a second signal connection terminal connected to the first via and overlying the first semiconductor chip;

a second dummy connection terminal spaced apart from the first via and the second signal connection terminal and overlying the first semiconductor chip; and a plurality of second semiconductor chips sequentially stacked on the second dummy connection terminal and the second signal connection terminal, each of the plurality of second semiconductor chips being electrically connected through a second via penetrating each of the plurality of second semiconductor chips, wherein a first area is a sum of an area in which the first signal connection terminal contacts the upper surface of the package substrate, and an area in which the first dummy connection terminal contacts the upper surface of the package substrate, wherein a second area is a sum of an area in which the second signal connection terminal contacts the first semiconductor chip, and an area in which the second dummy connection terminal contacts the first semiconductor chip, and wherein an absolute value of a difference between the first area and the second area is about 0.3 or less of the first area.

18. The semiconductor package of claim 17, wherein the first semiconductor chip comprises a first pad disposed on an upper surface thereof and in contact with the second signal connection terminal, and a second pad disposed on the upper surface of the first semiconductor chip and in contact with the second dummy connection terminal, and wherein the second area is a value measured at a boundary in which the first pad and the second signal connection terminal are in contact with each other and a boundary in which the second pad and the second dummy connection terminal are in contact with each other.

19. The semiconductor package of claim 17, wherein the first dummy connection terminal does not electrically connect the first semiconductor chip and the package substrate, and wherein the second dummy connection terminal does not electrically connect the first semiconductor chip and the plurality of second semiconductor chips.

* * * * *